United States Patent [19]

Gabillard et al.

[11] Patent Number: 5,003,566
[45] Date of Patent: Mar. 26, 1991

[54] HYPERFREQUENCY CIRCUIT COMPRISING A DYNAMIC DIVIDE-BY-TWO FREQUENCY DIVIDER CIRCUIT EMPLOYING SINGLE INTERRUPT FET, BUFFER AND INVERTER IN A LOOP

[75] Inventors: Bertrand Gabillard, Paris; Marc Rocchi, Emerainville, both of France

[73] Assignee: U.S. Philips Corporation, New York, N.Y.

[21] Appl. No.: 364,336

[22] Filed: Jun. 9, 1989

[30] Foreign Application Priority Data

Jun. 10, 1988 [FR] France .................... 88 07780

[51] Int. Cl.⁵ .................... H03K 23/52; H03K 27/00
[52] U.S. Cl. .................... 377/117; 377/121; 307/279
[58] Field of Search ............ 377/117, 121, 122, 74; 307/279, 475

[56] References Cited

U.S. PATENT DOCUMENTS

| 4,025,800 | 5/1977 | Wanlass | 377/121 |
| 4,114,052 | 9/1978 | Manabe et al. | 377/121 |
| 4,250,406 | 2/1981 | Alaspa | 307/279 |
| 4,450,369 | 5/1984 | Schuermeyer | 377/121 |
| 4,707,622 | 11/1987 | Takao et al. | 307/475 |

FOREIGN PATENT DOCUMENTS 0176218 8/1987 Japan .................... 377/121

OTHER PUBLICATIONS

M. Rocchi et al., "GaAs Digital Dynamic IC's for Applications up to 10 GHz", IEEE Journal of Solid-State Circuit, vol. SC-18, No. 3, Jun. 1983, pp. 369-376.

M. Rocchi et al., "GaAs Binary Frequency Dividers for High Speed Applications up to 10 GHz", Electronics Letters, vol. 17, No. 4, Feb. 19, 1981, pp. 168-169.

Primary Examiner—John S. Heyman
Attorney, Agent, or Firm—Jack D. Slobod

[57] ABSTRACT

A hyperfrequency dynamic divide-by-two frequency divider circuit includes an inverter stage A and a follower stage B, in which the output of the inverter stage is applied to the input of the follower stage via an interrupt transistor $T_1$ which is controlled by the hyperfrequency input signal H having a frequency $f_e$. The output Q of the follower stage B is fed back to the input of the inverter stage A and supplies the output signal having a frequency $f = f_e/2$. The operation of the divider takes place subject to the conditions:

$$1/[(\alpha+1)\, T_{pd}] \leq f_e \leq 1/[(\alpha+1)\tau_1]$$

where $\alpha = (T_e - \tau)/\tau$, in which relations $\tau_1$ is the propagation time in the interrupt transistor, $\alpha$ is the duty cycle, $T_e$ is the period of the input signal, $\tau$ is the period during which the interrupt transistor $T_1$ is closed, and $T_{pd}$ is the total propagation time which is formed by the sum of the propagation times in the inverter stage, the interrupter and the following stage.

17 Claims, 2 Drawing Sheets

HYPERFREQUENCY CIRCUIT COMPRISING A DYNAMIC DIVIDE-BY-TWO FREQUENCY DIVIDER CIRCUIT EMPLOYING SINGLE INTERRUPT FET, BUFFER AND INVERTER IN A LOOP

BACKGROUND OF THE INVENTION

1. Field of the Invention

The invention relates to an integrated semiconductor circuit, comprising a divide-by-two frequency divider circuit which comprises a loop which includes an inverter stage A, a follower stage B and a channel of an interrupt transistor which is controlled by a control signal.

The invention is used for the formation of digital integrated gallium arsenide hyperfrequency circuits, notably for frequency-stabilized sources or programmable dividers enabling synthesization of a set of stabilized frequencies.

2. Description of the Prior Art

It is generally known that in comparison with a static circuit a dynamic divide-by-two divider circuit utilises fewer active components and that the propagation time (Tpd) of a gate is shorter.

For comparison in this respect see the divider circuit described in "26GHz GaAs Room-Temperature Dynamic Divider circuit" by J. F. Jensen, L. G. Salmon et al in "GaAs IC Symposium" pp. 201-204, reference CH2506-4/87/0000-0201-C-1987 IEEE, and the circuit described in "Ultrahigh Speed GaAs Static Frequency Dividers" by J. F. Jensen, L. G. Salmon et al in "IEDM 86 pp. 476-479", reference CH 2381-2/86/0000-0476-C-1986 IEEE.

The first of said documents describes a dynamic divide-by-two frequency divider circuit which is based on the use of depletion-type field effect transistors having a pinch-off voltage of approximately −2.5 V. The divider is composed of two stages (see FIG. 5 of the first document).

The first stage is formed by an interrupt transistor which is controlled by the first clock signal $\phi$ and which is followed by an inverter gate of the BFL (Buffered FET Logic) type (described in FIG. 4 of the second document). The second stage is formed by an interrupt transistor which is controlled by the second, complementary clock signal $\bar{\phi}$ and which is followed by a follower gate.

The logic states are stored by charging or discharging the gate capacitances of the inverter and follower transistors.

The speed of the circuit is limited by the propagation time of the two gates (2Tpd).

The known dynamic divider circuit obviously has the advantage that it can be realised by means of a number of transistors which is substantially smaller than that used in the divider circuit described in the second document and that it has a shorter propagation time per gate (Tpd). This results in a lower power consumption, a greater suitability for large scale integration, and a higher maximum operating frequency.

However, even though the circuit described in the first document has a number of advantages, for a technical field where ever more powerful circuits are desired it still has a given number of drawbacks.

The maximum frequency is limited by the two gate propagation times:

$$F_{max} = 1/(2\ Tpd).$$

On the other hand, this circuit comprises two interrupt transistors each of which is controlled by two complementary clock signals.

The difficulty thus consists in that:
either these two complementary clock signals must be supplied by an external circuit,
or they must be generated in the circuit itself.

In the one as well as in the other case the problem exists that it is necessary to generate two strictly complementary clock signals having high frequencies such as those in the field envisaged by the present invention, that is to say approximately 20 Ghz.

SUMMARY OF THE INVENTION

Therefore the present invention proposes a divide-by-two frequency divider circuit:
which necessitates the use of one clock signal only,
which comprises a smaller number of transistors and hence offers a higher integration density even without taking into account the omission of the circuit necessary for generating a complementary clock signal,
which has a maximum frequency which is twice as high as in comparison with the present state of the art when the same technology is used.

It is to be noted, however, that the field in which the circuit in accordance with the invention is used and where the principal effect pursued is an increased maximum operating frequency, will be limited to one octave; this is not a drawback for the quasi-analog application of such digital circuits. Actually, the input frequency will be:

$$f_{Max}/2 < f_e < f_{Max}$$

where $f_{Max} = 1/(1\ Tpd)$ and a FAN-OUT$\simeq 1$ (which was also the case in the known circuit).

In accordance with the invention, the objects are achieved by means of a divide-by-two circuit which comprises a loop which includes an inverter stage A, a follower stage B, and only a channel of only a single interrupt transistor $T_1$, the control signal being an input signal H having the frequency to be divided, the divider circuit utilising aggregated propagation delays of said stages and the single interrupt transistor.

The cooperation between the interruption of the interrupt transistor and the aggregated propagation delays enables the divider circuit to operate suitably under predetermined conditions. The circuit behaves as a ring oscillator.

An embodiment of the integrated semiconductor circuit is characterized in that the divider circuit is realised in gallium arsenide in BFL technology and comprises MESFET or HFET (heterostructure FET) transistors. Gallium arsenide circuits of the type BFL are considered to be the fastest circuits. Moreover, the HFET transistors are very fast because of a very high electron mobility. In order to obtain the highest frequencies, the divider circuit is preferably realised in gallium arsenide by BFL technology utilizing HFET transistors.

BRIEF DESCRIPTION OF THE DRAWING

The invention will be described in detail hereinafter with reference to the accompanying drawings; therein.

DETAILED DESCRIPTION OF THE PREFERRED EMBODIMENTS

Figure 1A:
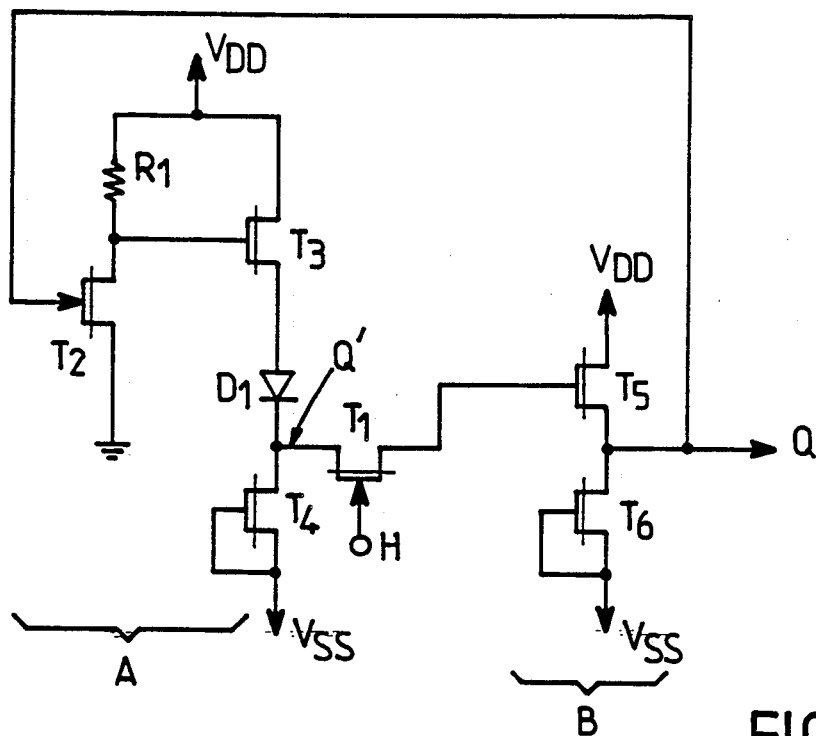
FIG. 1a diagrammatically shows an embodiment of the circuit in accordance with the invention.

An embodiment of the circuit in accordance with the invention is diagrammatically shown in FIG. 1a.

It is preferably realized by means of MESFET transistors of the charge depletion type of HFET (heterostructure FET) transistors of the depletion type whose pinch-off voltage is:

$$V_T \approx -0.6 \ V$$

This value of the pinch-off voltage is small in comparison with that of the transistors used for realizing the state of the art circuit and is chosen especially for obtaining a small logic swing and for increasing the maximum operating frequency even further.

Moreover, because use is made of transistors whose pinch-off voltage is in the order of $-0.6$ V, a single diode $D_1$ suffices for shifting the level in the inverter stage A as will be described hereinafter.

Figure 1B:
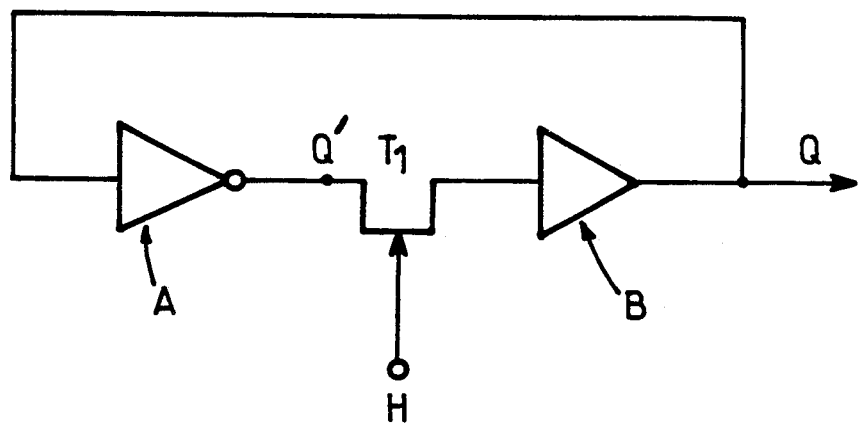
FIG. 1b shows the same circuit in the form of functional blocks.

As appears from the FIGS. 1a and 1b, the circuit in accordance with the invention comprises a first stage A which is formed by an inverter gate of the type BFL which includes one diode $D_1$, and a second stage B which is formed by a follower stage which is isolated from the inverter stage by an interrupt transistor $T_1$.

The interrupt transistor $T_1$ is controlled by the single input signal H having a frequency $f_e$ which will be divided by two in the circuit.

The inverter stage A is formed by a transistor $T_2$ whose drain is connected to the d.c. supply $V_{DD}$ via a resistance $R_1$ and whose source is connected to ground. This resistance may be replaced by a transistor having its gate and source interconnected.

The inverter stage also comprises a level shifting stage which is formed by a transistor $T_3$ whose drain is connected to the d.c. supply $V_{DD}$, whose gate receives the inverted signal available on the drain of $T_2$, and whose source is connected, via the diode $D_1$, to the current source transistor $T_4$ which has a gate and source connected to a second d.c. voltage $V_{SS}$.

The interrupt transistor $T_1$ is connected between the common node of the diode $D_1$ and the transistor $T_4$ and the gate of the upper transistor $T_5$ of the follower stage B.

This follower stage B is formed by the transistor $T_5$ whose drain is connected to the supply voltage $V_{DD}$ and whose source is connected to a current source transistor $T_6$, which transistor $T_6$ has its gate and source both connected to the second supply voltage $V_{SS}$. The output signal Q of the divider is available at the common node of the transistors $T_5$ and $T_6$ of the stage B and is applied to the gate of the inverter transistor $T_2$.

The dimensions of the transistors and the diode are given in Table I.

Notably the widths of the gates of the transistors $T_2$, $T_3$, $T_4$, $T_5$, $T_6$ are identical. The width of the gate of the interrupt transistor $T_1$ amounts to half the width of the above transistors.

The high and the low level of the input signal H are given by the relations of the table II where:

$(V_H)$low is the voltage corresponding to the low state of the input signal H.

$(V_H)$high is the voltage corresponding to the high state of the input signal H.

$(V_{Q'})$low is the voltage corresponding to the low state of the signal Q' present on the common node between the output of the inverter A and the transistor $T_1$ (see functional diagram of FIG. 1b).

$(V_{Q'})$high is the voltage corresponding to the high state of the signal Q' at the point defined above.

The functional diagram of FIG. 1b also shows the inverter stage A, the interrupt transistor $T_1$ which is controlled by the input signal H, the follower stage B which supplies the output signal Q whose frequency amounts to half the frequency of the signal H and which is applied to the input of the inverter stage A again.

The divider type in accordance with the invention behaves as a ring oscillator which is synchronized by the input or clock signal H which controls the interrupt transistor $T_1$.

The range of useful frequencies depends on the duty cycle of the input signal.

Figure 2:
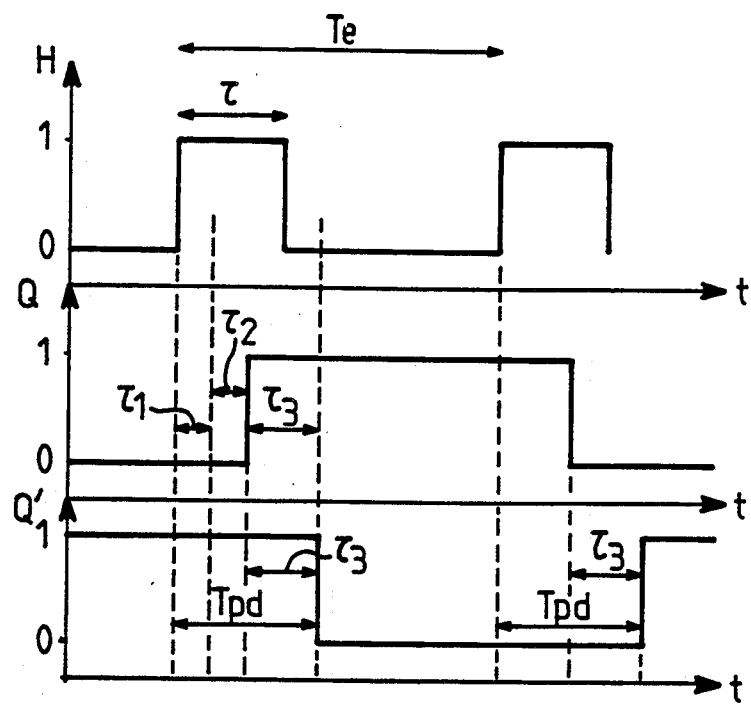
FIG. 2 shows the sequencing of the signals which propagate in the circuit.

The time diagram of FIG. 2 shows the sequencing of the signals in an embodiment in which the input signal H is a square wave signal and where $\tau_1$ = propagation time in $T_1$ $\tau_2$ = propagation time in B $\tau_3$ = propagation time in A Total propagation time required for one cycle $$Tpd = \tau_1 + \tau_2 + \tau_3$$

(see FIG. 1b).

As appears from FIG. 2, $\tau$ is the closing time of the interrupter $T_1$, that is to say the time during which the input signal H is high ($V_H = 1$) and hence the transistor $T_1$ a is short-circuit.

If the interrupter $T_1$ is closed (short-circuited) for a period $$\tau \leq Tpd$$

the circuit in accordance with the invention behaves as a divide-by-two frequency divider. This is realized when the conditions stated in table III are satisfied.

Figure 3:
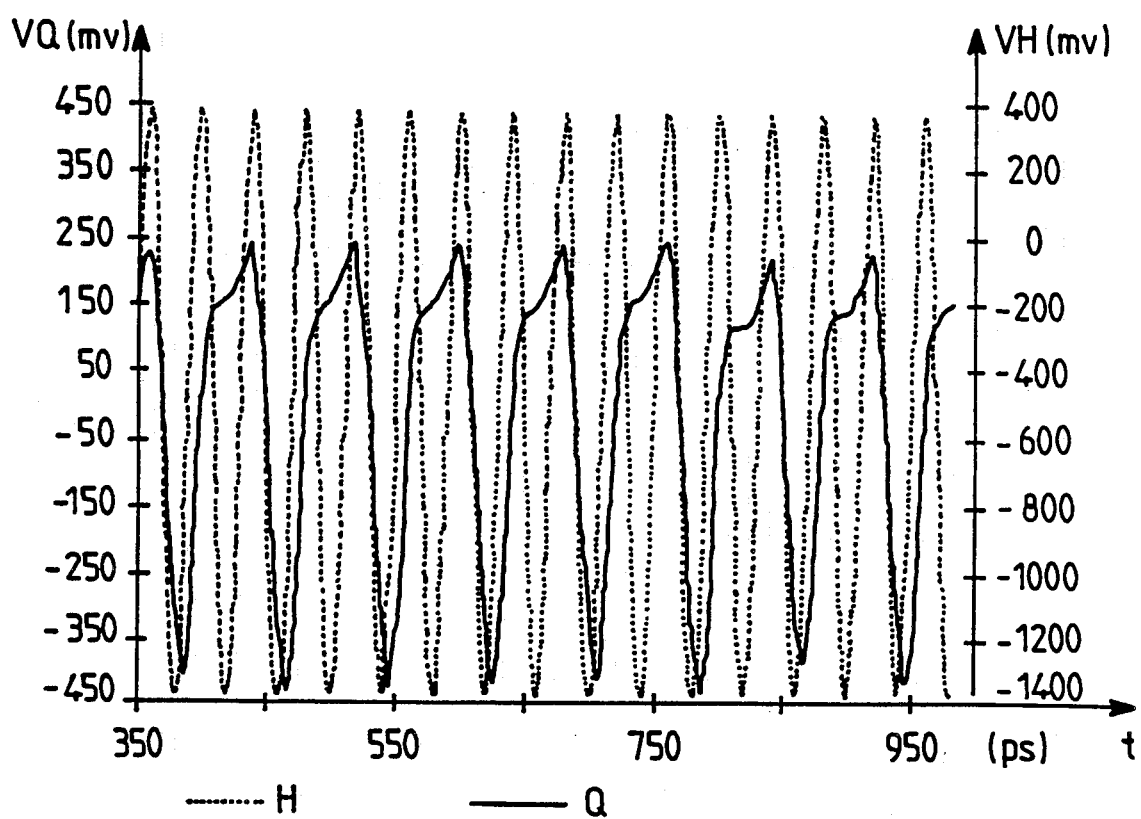
FIG. 3 shows the hyperfrequency input signals in the form of dotted lines and the hyperfrequency output signals in the form of non-interrupted lines.

FIG. 3 shows, in the form of a non-interrupted line, the curve representing the output signal whose amplitude is plotted in mV as a function of the time t in ps.

The frequency of this signal amounts to 12.5 GHz and is divided by two with respect to the frequency of the input signal which is shown in the same Figure by dotted lines; this input frequency is 25 GHz.

The levels of the input signal H vary from $-1.4$ V to $+0.4$ V. the levels of the output signal Q vary from $-0.45$ V to $+0.25$ V.

The power consumption is in the order of 40 mW.

In order to enable the output signal Q to be applied to a subsequent stage having an input impedance of some 50 Ohms, a buffer stage may be inserted, for example between the output Q and said subsequent external stage in a manner known to those skilled in the art.

TABLE I $V_{DD}$ = 1.5 to 2 V
$V_{SS}$ = −2 V to −3 V
$V_T$ = −0.6 to −1 V
L = width of the gate of the transistors or diodes
l = length of the gate of the transistors = 0.5 μm
$R_1$ = 500 Ohm

| Transistors | L |
|---|---|
| T2, T3, T4, T5, T6, D1 | 30 μm |
| T1 | 15 μm |

TABLE II $(V_H)$low $\leq (V_Q)$low + $V_T$ in order to block T1
$(V_H)$high $\leq (V_Q)$low + 0.7 V (where 0.7 V is the clipping voltage of the diode D1)
$(V_H)$high $\geq (V_Q)$high + $V_T$
Subject to the conditions of the table I
$(V_Q)$low $\approx$ −0.4 V
$(V_Q)$high $\approx$ 0.25 V
$V_T \approx$ −0.6 V
Therefrom, the operating conditions of the circuit are deduced:
$(V_H)$low $\leq$ −1.2 V
−0.35 V $\leq (V_H)$high $\leq$ 0.3 V

TABLE III $\tau > \tau_1$
$\tau \leq$ Tpd
Tpd $\leq T_e$ which is the period of the input signal H having the frequency $f_e$.
The duty cycle is defined as
$\alpha = (T_e - \tau)/\tau$
The operating conditions are thus expressed by
$\tau_1 \leq \tau = T_e/(\alpha + 1) \leq$ Tpd
and
$1/[(\alpha + 1)\text{Tpd}] \leq f_e \leq 1/[(\alpha + 1)\tau_1]$
$f_e \leq 1/\text{Tpd}$
Therefore, if $\alpha = 1$:
$\tfrac{1}{2}$Tpd $\leq f < 1/$Tpd $\leq \tfrac{1}{2} \tau_1$
Actually $\tau_1 \leq \tau_3$ because the propagation time across the interrupter T1 is very short, so that
$\tau_1 < (\tau_1 + \tau_2 + \tau_3)/2 =$ Tpd/2

We claim:

1. An integrated semiconductor circuit, comprising a divide-by-two frequency divider circuit which comprises a loop which includes an inverter stage (A), a follower stage (B) and consisting solely of a single interrupt transistor channel (T1) having a control input for an input signal (H) which is periodic at the frequency to be divided, the divider circuit utilizing aggregated propagation delays of the said inverter and follower stages and the single interrupt transistor.

2. A semiconductor circuit as claimed in claim 1, characterized in that the divider circuit is realized in Buffered FET Logic (BFL) technology.

3. An integrated semiconductor circuit as claimed in claim 1, characterized in that the divider circuit is realized in gallium arsenide using Buffered FET Logic (BFL) technology and comprises transistors of the MESFET or Heterostructure FET (HFET) type.

4. An integrated semiconductor circuit as claimed in claim 1, characterized in that the inverter stage (A) comprises an inverter transistor (T2), a source of which is connected to ground, a drain of which is connected to a first current source comprising, a supply voltage ($V_{DD}$) and a series load (R1), and a gate of which is coupled to an output of the follower stage (B), the inverter stage (A) also comprising a shifter stage which comprise a first shift transistor (T3), a gate of which is coupled to a first node common to the inverter transistor (T2) and the first current source, a drain of which is connected to the supply voltage ($V_{DD}$), and a source of which is connected to a second current source (T4, $V_{SS}$) via at least one diode (D1), a second node between the diode (D1) and the second current source constituting an output (Q) of the inverter stage (A).

5. An integrated semiconductor circuit as claimed in claim 1, characterized in that the follower stage (B) comprises a follower transistor (T5), a drain of which is connected to the supply voltage ($V_{DD}$), a source of which is connected to a third current source (T6, $V_{SS}$), the source of the follower transistor (T5) being an output of the follower stage (B) and a gate of which is connected to an output of the inverter stage (A).

6. An integrated semiconductor circuit as claimed in claim 4, characterized in that said second and third current sources comprise respective loads in series with a further supply voltage ($V_{SS}$).

7. An integrated semiconductor circuit as claimed in claim 4, characterized in that the follower stage (B) comprises a follower transistor (T5), a drain of which is connected to the supply voltage ($V_{DD}$), a source of which is connected to a third current source (T6, $V_{SS}$), the source of the follower transistor (T5) being an output of the follower stage (B), and a gate of which is connected to an output of the inverter stage (A).

8. An integrated semiconductor circuit as claimed in claim 5, characterized in that said second and third current sources comprise respective loads in series with a further supply voltage ($V_{SS}$).

9. An integrated semiconductor circuit as claimed in claim 7, characterized in that said second and third current sources comprise respective loads in series with a further supply voltage ($V_{SS}$).

10. A semiconductor circuit as claimed in claim 4, characterized in that the divider circuit is realized in Buffered FET Logic (BFL) technology.

11. A semiconductor circuit as claimed in claim 5, characterized in that the divider circuit is realized in Buffered FET logic (BFL) technology.

12. A semiconductor circuit as claimed in claim 6, characterized in that the divider circuit is realized in Buffered FET Logic (BFL) technology.

13. A semiconductor circuit as claimed in claim 9, characterized in that the divider circuit is realized in Buffered FET Logic (BFL) technology.

14. An integrated semiconductor circuit as claimed in claim 4, characterized in that the divider circuit is realized in gallium arsenide using Buffered FET Logic (BFL) technology and comprises transistors of the MESFET or Heterostructure FET (HFET) type.

15. An integrated semiconductor circuit as claimed in claim 5, characterized in that the divider circuit is realized in gallium arsenide using Buffered FET Logic (BFL) technology and comprises transistors of the MESFET or Heterostructure FET (HFET) type.

16. An integrated semiconductor circuit as claimed in claim 6, characterized in that the divider circuit is realized in gallium arsenide using Buffered FET Logic (BFL) technology and comprises transistors of the MESFET or Heterostructure FET (HFET) type.

17. An integrated semiconductor circuit as claimed in claim 9, characterized in that the divider circuit is realized in gallium arsenide using Buffered FET Logic (BFL) technology and comprises transistors of the MESFET or Heterostructure FET (HFET) type.

* * * * *